United States Patent [19]

Cory

[11] Patent Number: 5,229,718
[45] Date of Patent: Jul. 20, 1993

[54] METHOD FOR INCREASING RESOLUTION IN SOLID-STATE NMR SPECTRA OF ABUNDANT NUCLEI

[75] Inventor: David G. Cory, Boston, Mass.
[73] Assignee: Bruker Instruments, Inc., Billerica, Mass.
[21] Appl. No.: 642,396
[22] Filed: Jan. 17, 1991
[51] Int. Cl.$^5$ ............................................ G01V 3/00
[52] U.S. Cl. ..................................... 324/307; 324/309
[58] Field of Search ............... 324/307, 309, 310, 311, 324/312

[56] References Cited

U.S. PATENT DOCUMENTS

| | | | |
|---|---|---|---|
| 3,530,374 | 9/1970 | Haeberlen et al. | 324/300 |
| 3,781,650 | 12/1973 | Keller | 324/311 |
| 4,443,761 | 4/1984 | Levitt | 324/311 |
| 4,470,014 | 9/1984 | Levitt et al. | 324/311 |
| 4,486,709 | 12/1984 | Bendall | 324/314 |
| 4,510,449 | 4/1985 | Ernst et al. | 324/309 |
| 4,521,732 | 6/1985 | Pegg et al. | 324/300 |
| 4,682,107 | 7/1987 | Bendall et al. | 324/307 |
| 4,774,467 | 9/1988 | Sorensen | 324/311 |
| 5,027,072 | 6/1991 | Rinaldi | 324/307 |

OTHER PUBLICATIONS

IBM Technical Disclosure Bulletin, vol. 26, No. 8, Jan. 1, 1984 New York US, pp. 450–4152.
P. D. Murphy, Two-Dimension Method For High Resolution Solids NMR Spectroscopy Of Homonuclear Broadened Spins Journal Of Magnetic Resonance, vol. 90, No. 1, Oct. 15, 1990, Orlando, MN US pp. 205–213, D. G. Cory, et al "Time Suspension Multiple-Pulse Sequences: Applications to Solid-State Imaging".
Journal of Magnetic Resonance, vol. 77, No. 1, Mar. 1, 1988, Orlando, MN US pp. 53–64, T. Fujiwara, et al., "Composite Inversion Pulses with Frequency Switching and Their Application to Broadband Decoupling".
Journal of Magnetic Resonance, vol. 55, 1983, Orlando, MN US pp. 247–254; M. H. Levitt, et al: "Composite Pulses Constructed by a Recursive Expansion Procedure."
Trac, Trends In Analytical Chemistry, vol. 9, No. 8, Sep. 1, 1990, Cambridge GB pp. 253–263; M. Munowitz: "Approaches to High-Resolution in NMR in Solids".
Journal of Chemical Physics, vol. 71, No. 2, Jul. 15, 1979, New York US pp. 944–956, D. P. Burum et al: "Analysis of Multiple Pulse NMR in Solids III".
"Time-Suspension Multiple-Pulse Sequences: Applications to Solid-State Imaging", D. G. Cory, J. B. Miller and A. N. Garroway Journal of Magnetic Resonance, vol. 90, pp. 205–213 (1990).
"Analysis of Multiple Pulse NMR in Solids, III", D. P. Burum and W. K. Rhim, Journal of Chemical Physics, vol. 71, pp. 944 (1979).
"Symmetrized Pulse Sequences in High Resolution NMR In Solids", P. Mansfield, Journal of Physical Chemistry, vol. 4, pp. 144 (1971).
Low-Power Multipulse Line Narrowing in Solid-State NMR, Burum et al. Journal Mag. Resonance vol. 44 (1981) pp. 173–188.
Frequency-Switched Pulse Sequences: Homonuclear Decoupling and Dilute Spin NMR in Solids, Bielecki et al. Chem. Phys. Letters, Mar. 1989 vol. 155 No. 4,5.
Heteronuclear Correlation Spectroscopy In Rotating Solids, Caravatti et al. Chemical Physics Letters Sep. 1983 vol. 100 No. 4.
Heteronuclear Solid-State Correlation Spectroscopy, Caravatti et al. Chemical Physics Letters Jul. 1982 vol. 89 No. 5.
Two-Dimensional Heteronuclear Chemical Shift Correlation Spectroscopy In Rotating Solids, Roberts et al. Am. Chem. Soc. vol. 106 No. 9, 1984.

*Primary Examiner*—Louis Arana
*Attorney, Agent, or Firm*—Cesari and McKenna

[57] ABSTRACT

A multiple-pulse RF pulse sequence reduces homonuclear dipolar coupling more efficiently relative to other known pulse sequences and is relatively insensitive to inhomogeneous RF fields, pulse imperfections and transmitter misadjustments so that it can be used on less sophisticated instruments and does not require long setup times. The inventive RF pulse sequence is constructed from selected sets of known six-pulse cycles called dipolar decoupled inversion pulses or composite inversion pulses. The dipolar decoupled inversion pulses are, in turn, constructed from standard solid echo pulse pairs. The six-pulse cycles are selected so that zero-order term of the average dipolar Hamiltonian is zero.

16 Claims, 5 Drawing Sheets

FIG. 1 PRIOR ART $\longleftrightarrow \pi y \longleftrightarrow \longleftrightarrow \pi\text{-}y \longleftrightarrow \longleftrightarrow \pi\text{-}x \longleftrightarrow \longleftrightarrow \pi x \longleftrightarrow$

$\tilde{I}_z$: $z$ $y$ $-x$ $z$ $-y$ $-x$ $-z$ $-x$ $-y$ $z$ $-x$ $y$ $z$ $-y$ $-x$ $-z$ $-y$ $x$ $-z$ $x$ $-y$ $-z$ $-x$ $-y$ $z$

METHOD FOR INCREASING RESOLUTION IN SOLID-STATE NMR SPECTRA OF ABUNDANT NUCLEI

FIELD OF THE INVENTION

This invention relates to solid state NMR spectroscopy and, in particular, to radio frequency pulse sequences for improving the resolution of abundant nuclei spectra by suppressing homonuclear dipolar interactions.

BACKGROUND OF THE INVENTION

Nuclear magnetic resonance (NMR) is a phenomenon exhibited by a select group of atomic nuclei and is based upon the existence of nuclear magnetic moments in these nuclei (termed "NMR active" nuclei). When an NMR active nucleus is placed in a strong, uniform and steady magnetic field, it precesses at a natural resonance frequency known as a Larmor frequency, which is characteristic of each nuclear type and is dependent on the applied field strength in the location of the nucleus. Typical NMR active nuclei include $^1$H (protons), $^{13}$C, $^{19}$F and $^{31}$P. The resonant frequencies of the nuclei can be observed by monitoring with a radio frequency (RF) receiver the transverse magnetization which results after a strong RF pulse. It is common practice to convert the measured signal to a frequency spectrum by means of Fourier transformation.

Although identical nuclei have the same frequency dependence upon the magnetic field, differences in the chemical environment of each nucleus can modify the applied magnetic field in the local vicinity of the nucleus, so that nuclei in the same sample do not experience the same net magnetic field. The differences in the local magnetic field result in spectral shifts in the Larmor frequencies between two such chemically non-equivalent nuclei, called "chemical shifts". These chemical shifts are interesting in that they reveal information regarding the number and placement of the atoms in a molecule and in the positioning of adjacent molecules with respect to each other in a compound.

Unfortunately, it is not always possible to interpret the frequency spectra produced by the chemical shifts because of other interfering and dominant interactions. This is particularly true in NMR spectroscopy of solids. In liquid NMR spectroscopy the rapid motion of the liquid molecules tends to isolate the nuclei and separate the nuclear interactions, so that it is easier to distinguish separate nuclei in the final output. In solid state NMR, there are many interactions between the molecules which obscure the output. For example, the magnetic moments in neighboring nuclei perturb each other, resulting in interactions called dipole-dipole couplings. These couplings tend to broaden the characteristic resonance peaks and obscure the "fine" resonant structure produced by the chemical shifts. An additional problem found in solids, which is not present in liquids, is that the orientation of the solid molecules is relatively fixed with respect to the applied Zeeman field and, accordingly, the chemical shifts are anisotropic, in that a component of the resonant frequency depends on the physical orientation of the molecules with respect to the applied field.

Therefore, it is essential to suppress some interactions over others to obtain a meaningful output. This is usually done by perturbing the system at selected frequencies to cause unwanted interactions to cancel or average to a reduced amplitude. For example, in solids, the aforementioned chemical shift anisotropy is usually greatly reduced by orienting the solid sample at the "magic angle" (54° 44') with respect to the applied Zeeman field and physically rotating the solid at a relatively rapid rate causing the anisotropic field components to average to zero. This technique is called Magic Angle Sample Spinning (MASS).

Similarly, by well-known techniques, it is possible to reduce the unwanted spin-spin interactions by irradiating the nuclei with additional pulses of RF energy at or near the Larmor frequencies. By properly selecting various orientations and phases of the RF pulses, the polarization of the perturbing nuclear spin systems in neighboring groups can be changed, effectively averaging out the spin interactions so that the contribution to the final output is greatly diminished. For example, such known RF sequences include the so called WAHUHA sequence described in detail in U.S. Pat. No. 3,530,374; the so-called MREV-8 sequence described in articles by P. Mansfield, *Journal of Physical Chemistry*, V. 4, p. 1444 (1971) and W. K. Rhim, D. D. Elleman and R. W. Vaughan, *Journal of Chemical Physics*, v. 58, p. 1772 (1972); and a so called BR-24 sequence described in an article by D. P. Burum and W. K. Rhim, *Journal of Chemical Physics*, v. 71, p. 944 (1979).

In other known techniques, this latter pulsing technique is combined with the aforementioned sample spinning in a technique called CRAMPS (Combined Rotation And Multiple Pulse Spectroscopy).

Although the aforementioned RF pulse sequences are effective in eliminating dipolar coupling, in practice, they are difficult to implement since they generally require special instrumentation and a high degree of technical skill. In particular, the methods are highly susceptible to interference due to inhomogeneous RF fields, pulse imperfections and transmitter misadjustments. Consequently, very precise and sophisticated NMR instruments must be used and great care must be taken to properly adjust the instruments during use.

Accordingly, it is an object of the present invention to provide a method for increasing the resolution of an NMR solid-state spectrum.

It is another object of the present invention to provide a method for increasing the resolution of an NMR solid-state spectrum which does not require special instrumentation or experimental skills.

It is yet another object of the present invention to provide a method for increasing the resolution of an NMR solid-state spectrum which is tolerant of RF field inhomogeneity, pulse imperfections, and transmitter misalignment.

It is a further object of the present invention to provide a method for increasing the resolution of an NMR solid-state spectrum which increases resolution by utilizing a dipolar decoupling multiple pulse RF pulse sequence.

It is yet a further object of the present invention to provide a method for increasing the resolution of an NMR solid-state spectrum in which a multiple-pulse RF pulse sequence time averages to zero the nuclear evolution due to homonuclear dipolar couplings.

SUMMARY OF THE INVENTION

The foregoing problems are solved and the foregoing objects are achieved in one illustrative embodiment of the invention in which a multiple pulse RF pulse sequence reduces homonuclear dipolar coupling more efficiently relative to other known pulse sequences. Further, the inventive pulse sequence is relatively insensitive to inhomogeneous RF fields, pulse imperfections and transmitter misadjustments so that it can be used on less sophisticated instruments and does not require long setup times.

More particularly, the inventive RF pulse sequence is constructed from selected sets of known six-pulse cycles called dipolar decoupled inversion pulses or composite inversion pulses. The dipolar decoupled inversion pulses are, in turn, constructed from standard solid echo pulse pairs.

In one illustrative embodiment, a 24 pulse sequence comprised of four composite inversion pulses is used. In another embodiment a twelve pulse sequence is used.

DETAILED DESCRIPTION OF THE PREFERRED EMBODIMENTS

Figure 1:
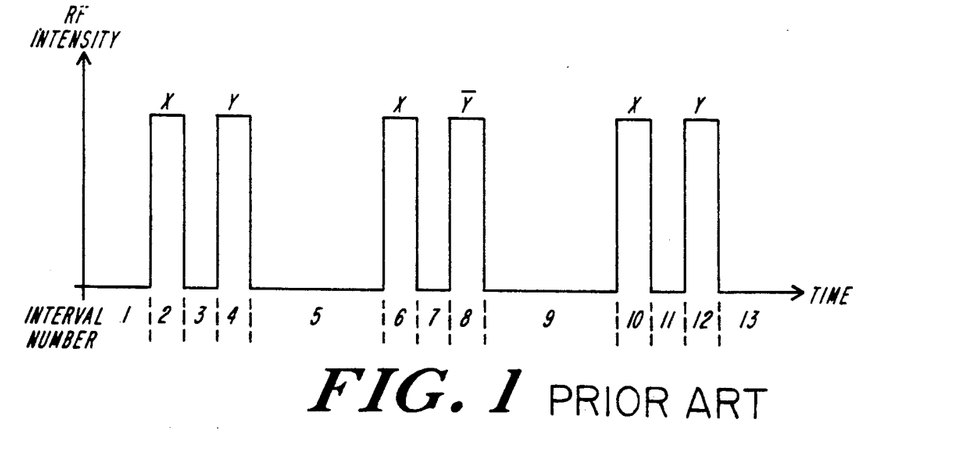
FIG. 1 is a schematic illustration of a known six-pulse composite inversion pulse with the various time intervals denoted.

FIG. 1 shows an example of a known six-pulse composite inversion pulse which comprises the basic building block of the inventive pulse sequence. Composite pulses and their characteristics are known in the art and are described in more detail, for example, in "Time suspension Multiple Pulse Sequences: Application to Solid State Imaging", D. G. Cory, J. B. Miller and A. N. Garroway, *Journal of Magnetic Resonance*, v. 90, p. 205 (1990), which article is hereby incorporated by reference.

The six-pulse sequence is made of thirteen time intervals numbered illustratively as intervals 1-13. There are three pulse pairs with each pulse having a time duration of $\alpha$ which comprise time intervals 2, 4, 6, 8, 10 and 12. A time delay between pulses comprises time intervals 3, 7, and 11. In a standard solid echo pulse pair this delay is set at one half of the time intervals between pulse pairs (time intervals 1, 5, 9 and 13); however, as described below, the characteristics of the inventive sequence are largely maintained even if the sequence is run "semi windowless" (with $\tau$ set to zero).

As previously mentioned, after an initial excitation, the nuclear spins change or evolve in time in known ways which can be described mathematically by means of a mathematical operator known as the Hamiltonian operator. The overall Hamiltonian can be considered a the sum of the Hamiltonian operators each of which results from separate perturbations such as dipolar coupling, chemical shifts, susceptibility and field gradient. Consequently, the effect of the six-pulse sequence on homonuclear dipolar coupling can be determined by examining the Hamiltonian operator describing homonuclear dipolar spin coupling for the inversion pulse.

Because the effects of a multiple pulse sequence on a Hamiltonian operator are quite complex, it is advantageous to apply a simplification known as average Hamiltonian theory. Average Hamiltonian theory is a known simplification which is described in more detail in an article by U. Haeberlen and J. S. Waugh, *Physical Review*, v. 175, p. 453 (1968); "Advances in Magnetic Resonance", U. Haeberlen, v. 12, suppl. 1, edited by J. S. Waugh, Academic Press (1982) and "Transient Techniques in NMR of Solids", B. C. Gerstein and C. R. Dybowski, Academic Press (1985), which article and references are hereby incorporated by reference.

More particularly, if a Hamiltonian is assumed to be piecewise constant and periodic, average Hamiltonian theory takes on a particularly simple form in which a propagator is defined as $$U(\tau_c) = exp(-iH_n t_n) exp(-iH_{n-1} t_{n-1}) \ldots exp(-iH_1 t_1), \quad (1)$$

where $H_n$ is the active Hamiltonian during the nth time interval. Average Hamiltonian Theory allows the products in Eq. (1) to be replaced with a simple propagator of the form $$U(\tau_c) = exp(-i\bar{H}(\tau_c)\tau_c). \quad (2)$$

Where $\bar{H}(\tau_c)$ is the average Hamiltonian. The average Hamiltonian may be obtained directly by means of a conventional mathematical expansion known as the "Magnus expansion". The average Hamiltonian as given by the Magnus expansion is:

$$\bar{H}(\tau_c) = \bar{H}^{(0)} + \bar{H}^{(1)} + \bar{H}^{(2)} + \ldots \quad (3)$$

where the first two ("zero order" and "first-order") terms are given by:

$$\bar{H}^{(0)} = \frac{1}{\tau_c} \{H_1 t_1 + H_2 t_2 + \ldots + H_n t_n\}, \quad (4)$$

and $$\bar{H}^{(1)} = \quad (5)$$
$$-\frac{i}{2\tau_c} \{[H_2 t_2, H_1 t_1] + [H_3 t_3, H_1 t_1] + [H_3 t_3, H_2 t_2] + \ldots \}.$$

Higher order terms have similar form. Consequently, the average Hamiltonian can be calculated by calculating the Hamiltonians and their products for each time interval and summing the results.

In high magnetic fields, the truncated form of the homonuclear dipolar Hamiltonian is:

$$\tilde{H}_D^{(0)} = \sum_{i<j} \sum_j b_{i,j} (I_i \cdot I_j - 3I_{zi}I_{zj}) \quad (6)$$

where $$b_{i,j} = \frac{\gamma^2 h^2}{8\pi^2 r_{i,j}^3} (3\cos^2\theta_{i,j} - 1). \quad (7)$$

Thus, for the calculation of the dipolar Hamiltonian, it is sufficient to examine terms of the form $\tilde{I}_z I'_z$ integrated over each time interval, where $\tilde{I}_z$ is the $I_z$ operator in the toggling reference frame. Multi-column Table I shows the interval number (column one); time duration (column 2); the RF phase (column 3) and the $I_z I'_z$ term (column four) for each pulse in the 13 time intervals denoted in FIG. 1. With respect to Table I it is assumed that each pulse has a duration of $\alpha$ and that the short time delay between pulses is $\tau$ in the delta function RF pulse limit.

With regard to $\tilde{I}_z I'_z$ terms, an examination of Table I, column 4, indicates the following:

(a) all terms containing the expression $\cos\theta\sin\theta$ cancel.

(b) all terms containing the expression $\cos^2\theta$ have a corresponding term which contains the expression $\sin^2\theta$ so that when these terms are integrated over the appropriate time interval they may be rewritten as follows: $I_i I_j \int_0^\alpha (\cos^2\theta + \sin^2\theta) dt = I_i I_j \int_0^\alpha dt = I_i I_j \alpha$.

TABLE I

Zero Order Dipolar Hamiltonian for a Composite Inversion Pulse.

| # | length | RF | toggling frame $I_z I_z'$ |
|---|--------|----|---------------------------|
| 1 | t-α/2 | | $I_z I'_z$ |
| 2 | α | x | $I_z I'_z\cos^2\theta + [I_z I'_y + I_y I'_z]\cos\theta\sin\theta + I_y I'_y\sin^2\theta$ |
| 3 | 2t-α | | $I_y I'_y$ |
| 4 | α | y | $I_y I'_y\cos^2\theta - [I_y I'_x + I_x I'_y]\cos\theta\sin\theta + I_x I'_x\cos^2\theta$ |
| 5 | t-α | | $I_x I'_x$ |
| 6 | α | x | $I_x I'_x\cos^2\theta + [I_x I'_z + I_z I'_x]\cos\theta\sin\theta + I_z I'_z\cos^2\theta$ |
| 7 | 2t-α | | $I_z I'_z$ |
| 8 | α | -y | $I_z I'_z\cos^2\theta - [I_z I'_y + I_y I'_z]\cos\theta\sin\theta + I_y I'_y\cos^2\theta$ |
| 9 | t-α | | $I_y I'_y$ |
| 10 | α | x | $I_y I'_y\cos^2\theta + [I_y I'_x + I_x I'_y]\cos\theta\sin\theta + I_x I'_x\cos^2\theta$ |
| 11 | 2t-α | | $I_x I'_x$ |
| 12 | α | y | $I_x I'_x\cos^2\theta - [I_x I'_z + I_z I'_x]\cos\theta\sin\theta + I_z I'_z\cos^2\theta$ |
| 13 | t-α/2 | | $I_z I'_z$ |

Consequently, the zero order dipolar Hamiltonian term ($H_D^{(0)}$) has the form:

$$\sum \int \tilde{I}_z I_z' dt' = 3\tau [I_x I_{x'} + I_y I_{y'} + I_z I_{z'}] \quad (8)$$

Comparing the result in equation (8) with the truncated dipolar Hamiltonian in equation (6) it can be seen that the term $(I_i \cdot I_j - 3I_{zi}I_{zj})$ in equation (6) becomes zero for this pulse sequence which implies that, for the six-pulse sequence, the zero order dipolar Hamiltonian is equal to zero, including the effects of finite pulses.

The zero order averaged Hamiltonian of an interaction is often described as an effective field and so a multiple-pulse sequence may be though of as changing the strength and direction of an interaction (typically the chemical shift). This change in strength is generally associated with a scaling factor and the direction is important in implementing the sequence so that the initial state of the magnetization may be placed perpendicular to the effective field about which it appears to precess when sampled stroboscopically. It is desirable to retain a large scaling factor and eliminate all important sources of broadening while still keeping the overall pulse sequence as short as possible. The total pulse sequence time is not of prime importance in designing multiple-pulse sequences because various contributions to the average Hamiltonian usually average to zero over fractions of the entire sequence, but it is generally desirable to average the largest contributions first.

Consequently, the inventive sequence is constructed with a sub-sequence building block which is designed to average the most important unwanted contributions to the Hamiltonian quickly. Using this building block, a sequence is built up which averages progressively more and more unwanted contributions. Ideally, the effective field is maintained in the same direction so that the largest scaling factor is obtained. The basic sequence is then permuted as much as possible while retaining the effective field to build up a longer sequence—the idea being that each sub sequence individually has the same averaging characteristics and the built up sequence, with several sequential sub-sequences, at worst, leaves the averaging as is and most likely improves it. Since the magnetization is sampled once every primitive sequence, nothing is sacrificed in terms of bandwidth or sensitivity. Some sampling related modulations may be present, but these are easily eliminated by conventional techniques and will be ignored in the following discussion.

Figure 2A:
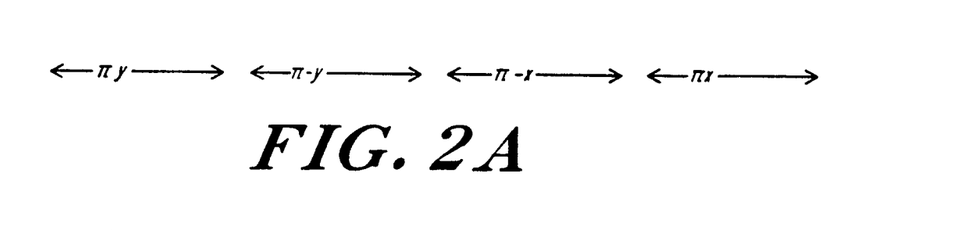
FIG. 2A illustrates the $\pi$ pulse equivalents for the pulse sequence, shown in FIG. 2B.
Figure 2B:
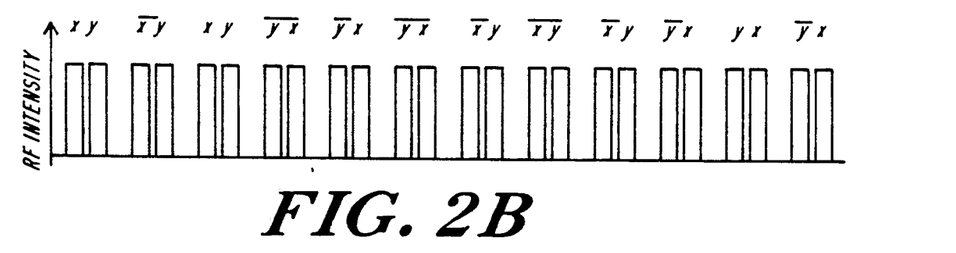
FIG. 2B is a schematic illustration of an illustrative 24 pulse multiple RF pulse sequence constructed in accordance with the principles of the invention.
Figure 2C:
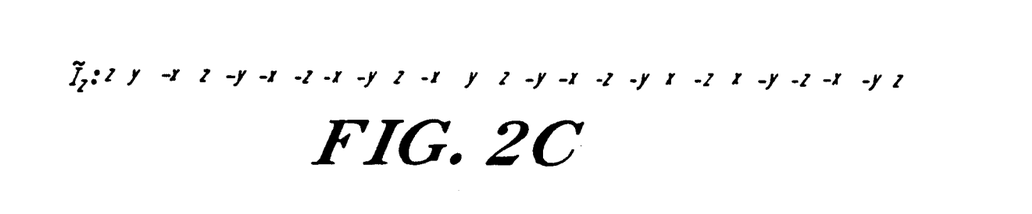
FIG. 2C shows $I_z$ in the toggling reference frame for the pulse sequence in FIG. 2B.

A 24-pulse sequence constructed in accordance with the principles of the invention is shown in FIGS. 2A-2C. FIG. 2B shows a schematic diagram of the actual pulse cycle. Each rectangular box in the sequence represents a separate pulse. In FIG. 2A, the letter designations X or Y above each box indicates the RF phase (the $\pi$ pulse equivalents are also shown in FIG. 2A. By convention, the applied fields are referenced to a Cartesian coordinate system with the applied Zeeman field pointing along the Z axis. The applied RF fields are polarized 90° to the Zeeman field or along the X and Y axes. Since the X and Y axes are arbitrary directional designations, the pulse designations of X and Y are taken to represent relative phases of the signals. For example a RF pulse designated as an X pulse has a relative phase shift of 90° with respect to an RF pulse designated as a Y pulse. Similarly, an RF pulse designated as X or −X has a relative phase shift of 180° with respect to an X pulse. FIG. 2C shows $I_z$ in the toggling reference frame for the pulse sequence in FIG. 2B.

The pulse sequence shown in FIG. 2B could also have been implemented as a 12-pulse cycle, but it is convenient to discuss it and implement it as a 24-pulse cycle for reasons discussed below. Each six-pulse interval acts as a dipolar decoupled inversion pulse in the absence of linear $I_z$ operators. Every second inversion pulse is symmetric with to the one before it and this particular arrangement of the toggling frame states insures that odd ordered correction terms to the average Hamiltonian are zero in the delta function pulse approximation. It can also be shown that the second order dipolar correction term for each composite inversion pulse is zero as discussed in an article by D. P. Burum and W. K. Rhim, *Journal of Chemical Physics*, v.

71, p. 944 (1979) which article is hereby incorporated by reference. An important distinction of the inventive pulse sequence from other known sequences is that, as discussed above, the zero order dipolar average Hamiltonian is zero including the effects of finite pulses for each composite inversion pulse.

Table II shows a comparison of the inventive 24-pulse sequence to a selection of conventional, known multiple pulse sequences.

TABLE II

PROPERTIES OF MULTIPLE-PULSE CYCLES

|  | WAHUHA | MREV-8 | BR-24 | new 24-pulse cycle |
|---|---|---|---|---|
| $H_D^{(0)}$ | $\neq 0$ | 4 s.e.p.p. | 4 s.e.p.p. | 3 s.e.p.p. |
| $H_X^{(odd)}$ | 2 s.e.p.p. | 2 s.e.p.p. | 12 s.e.p.p. | 6 s.e.p.p. |
| $H_D^{(2)}$ | $\neq 0$ | $\neq 0$ | 6 s.e.p.p. | 3 s.e.p.p. |
| scaling factor | 0.571 | 0.47 | 0.385 | .318 |

$H_D^{(0)}$ includes the effects of finite pulses.
s.e.p.p. = solid echo pulse pair As one progresses across the table from the so-called WAHUHA cycle through the known BR-24 cycle, more terms in the Magnus expansion of the dipolar Hamiltonian are averaged. The WAHUHA cycle, which is composed of only two solid echo pulse pairs, does not cancel even the zero order dipolar Hamiltonian term when finite pulse widths are taken into consideration, but the cycle does possess the correct symmetry for eliminating all odd order terms. The MREV-8 cycle (described in detail in articles by P. Mansfield, *Journal of Physical Chemistry*, V. 4, p. 1444 (1971) and W. K. Rhim, D. D. Elleman and R. W. Vaughan, *Journal of Chemical Physics*, v. 58, p. 1772 (1972) is composed of two phase-shifted WAHUHA cycles so it retains WAHUHA's symmetry suppression of odd-ordered terms and, in addition, causes the zero order dipolar term to vanish including finite pulsewidth effects. A small sacrifice in scaling factor accompanies this, but the improved line narrowing efficiency more than compensate the reduction in scaling factor.

The known BR-24 sequence (described in detail in an article by D. P. Burum and W. K. Rhim, *Journal of Chemical Physics*, v. 71, p. 944 (1979) is no longer composed of WAHUHA cycles, but the zero-order dipolar term still vanishes every four solid echo pulse pairs and, additionally, the second order dipolar term now vanishes over six solid echo pulse pairs. The cycle's symmetry is such that odd-ordered terms vanish over a complete cycle. The BR-24 cycle has a further reduction in scaling factor, but for very rigid materials, the resolution is superior to MREV-8. Molecular motions can, of course interfere with the coherent averaging of multiple-pulse sequences and those sequences which take longer to accomplish this averaging are more susceptible to this interference.

The inventive 24-pulse cycle shown in FIG. 2B accomplishes all of the averaging that the BR-24 sequence does, but much more efficiently. The zero order dipolar term is eliminated over three solid echo pulse pairs rather than four and both odd order term and the second order dipolar terms are averaged twice as fast as is the case with the BR-24 sequence.

From Table II, it is clear that the inventive pulse sequence could have been described as a 12-pulse sequence since all of the important averaging is completed with that sequence. More particularly, a 12-pulse sequence can be constructed illustratively by taking only the first 12 pulses shown in FIG. 2B so that a larger scaling factor is achieved. For the first twelve pulses, the effective field is $$H_{eff}^{12} = \qquad (9)$$

$$I_x\left[-8\tau + 4a - \frac{16a}{\pi}\right] + I_y[2\tau] + I_z\left[2\tau - 2a + \frac{8a}{\pi}\right]$$

compared to an effective field for the 24-pulse sequence of:

$$H_{eff}^{24} = I_x\left[-8\tau + 4a - \frac{16a}{\pi}\right] + I_y\left[-8\tau + 4a - \frac{16a}{\pi}\right]. \qquad (10)$$

The difference in the scaling factor is less than 24%, and since the 24-pulse cycle has an effective field oriented conveniently along [110] direction it is preferable to the 12 pulse sequence.

Figure 3:
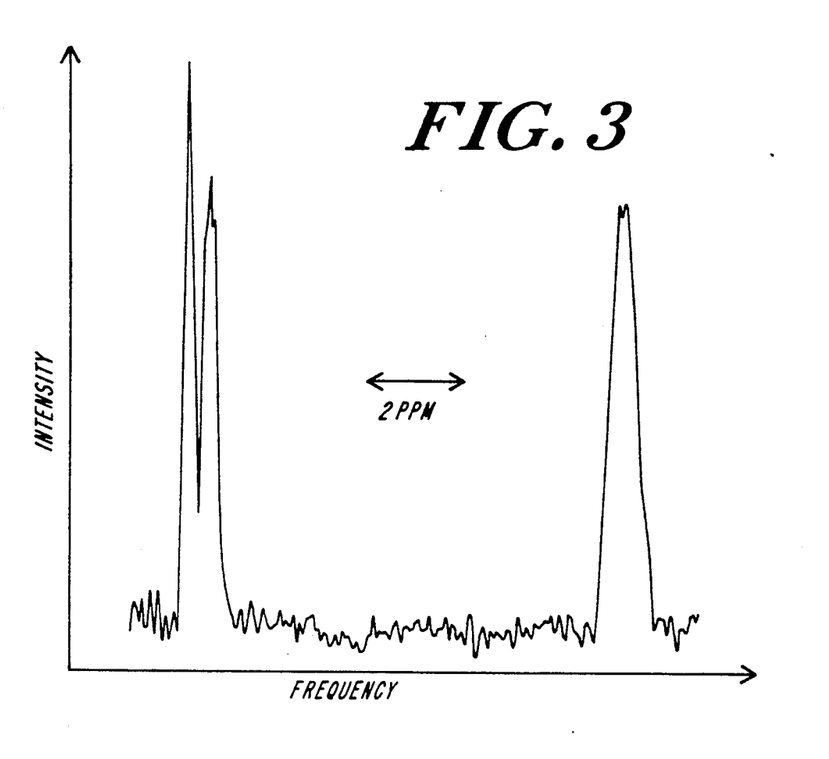
FIG. 3 is a spectral plot of the results of a CRAMPS experiment on malonic acid using the RF pulse sequence illustrated in FIG. 2.

FIG. 3 shows the experimental spectrum obtained for malonic acid using the 24-pulse sequence shown in FIG. 2B. The spectrum shown in FIG. 3 was acquired on an MSL-400 NMR spectrometer manufactured by Bruker Instruments, Inc., 19 Fortune Drive, Manning Park, Billerica, Mass. 01821. The experiment was a CRAMPS experiment and a 1.5 microsecond H/2 excitation pulse was used with a 126 microsecond cycle time. Pre pulses were $\pi/2$ pulses applied along the x and $-y$ directions and data was collected with single-sideband detection along the x and $-x$ directions. Data were collected stroboscopically twice per cycle. The MAS spinning rate was two kilohertz. This arrangement does not yield the maximum signal-to-noise ratio, but it is a simple method of suppressing spin locked magnetization. As shown in FIG. 3, the observed resolution is quite good; the two carbonyl resonances of malonic acid are well resolved.

Figure 4:
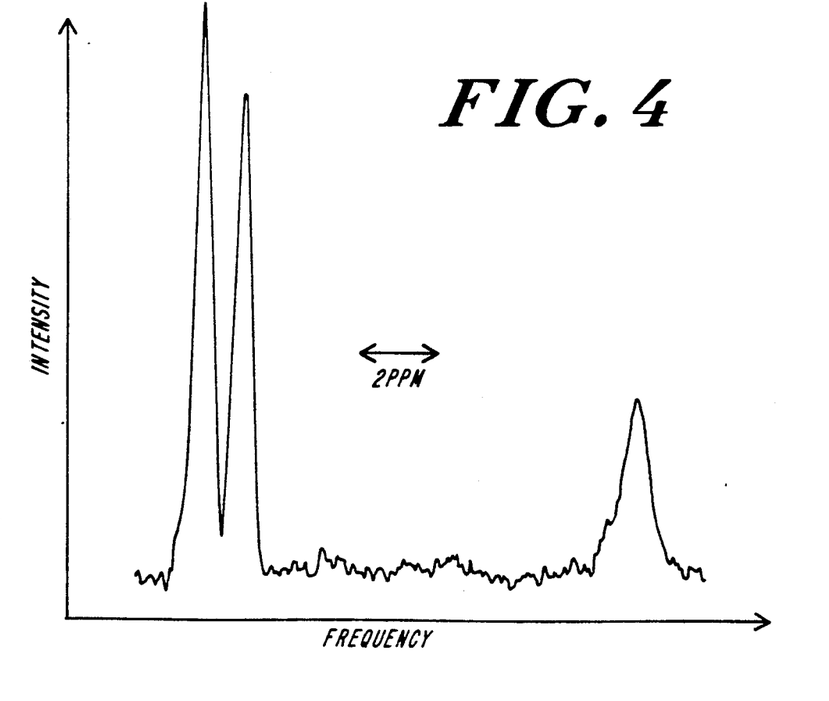
FIG. 4 is a spectral plot of the results of a CRAMPS experiment on adipic acid using the RF pulse sequence illustrated in FIG. 2.

FIG. 4 shows the experimental spectrum obtained for adipic acid using the 24-pulse sequence shown in FIG. 2B. The spectrum shown in FIG. 4 was acquired using the same experimental setup as was used to acquire the spectrum in FIG. 3 with the exception that the two spectra were acquired on opposite sides of the carrier frequency in order to place the resonances of interest at the offset which yielded the best resolution. As shown in FIG. 4, resolution was excellent with the two methylene resonances of adipic acid nearly baseline resolved.

Figure 5A:
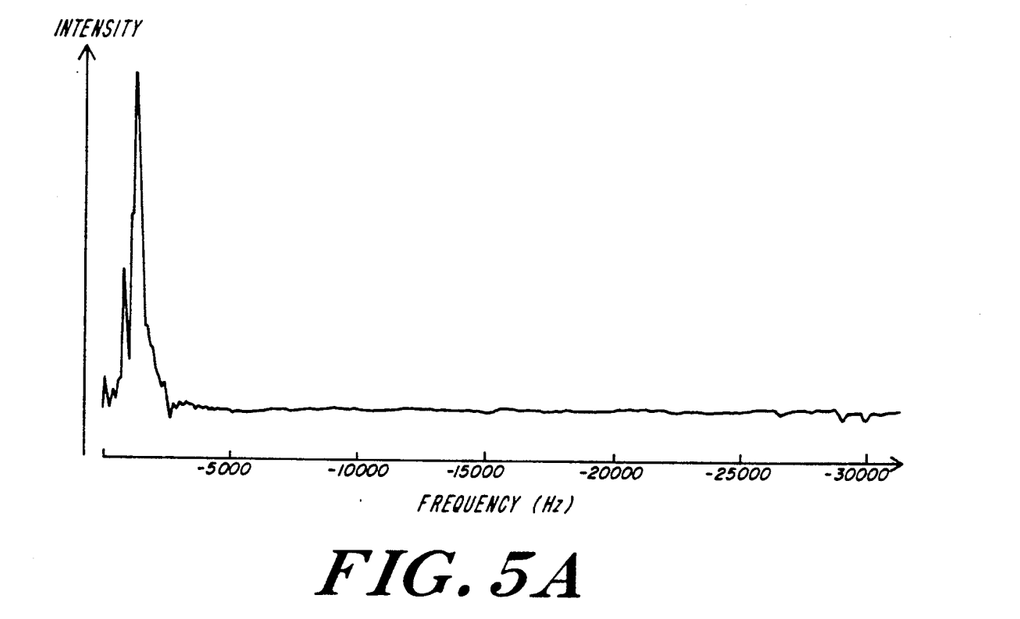
FIG. 5A is a spectral plot of the results of a CRAMPS experiment on para-dimethyoxybenzene using a prior art MREV-8 pulse sequence.
Figure 5B:
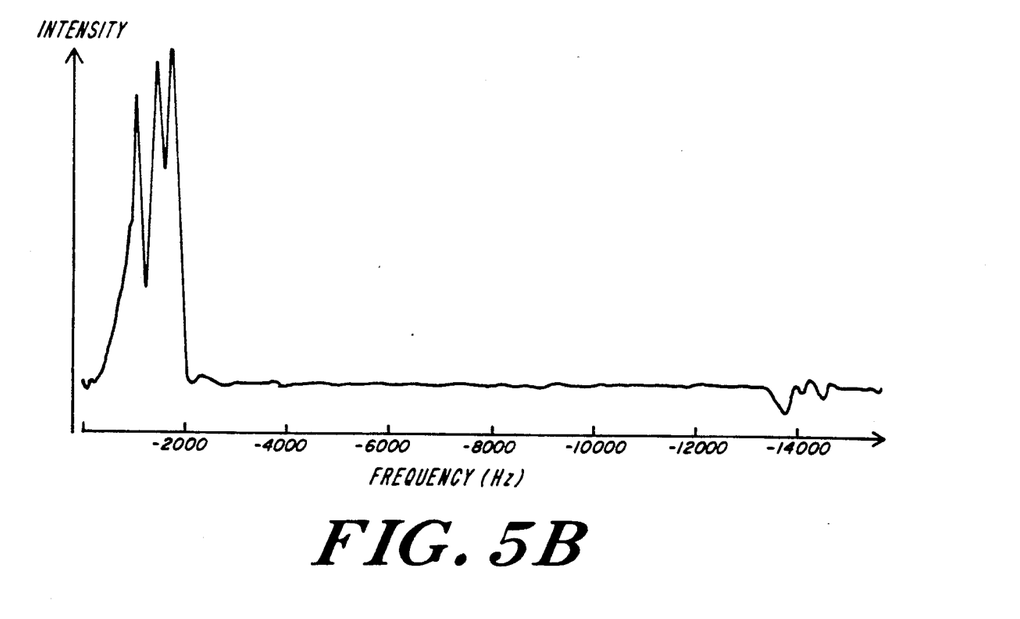
FIG. 5B is a spectral plot of the results of a CRAMPS experiment on para-dimethyoxybenzene using a prior art BR-24 pulse sequence.
Figure 5C:
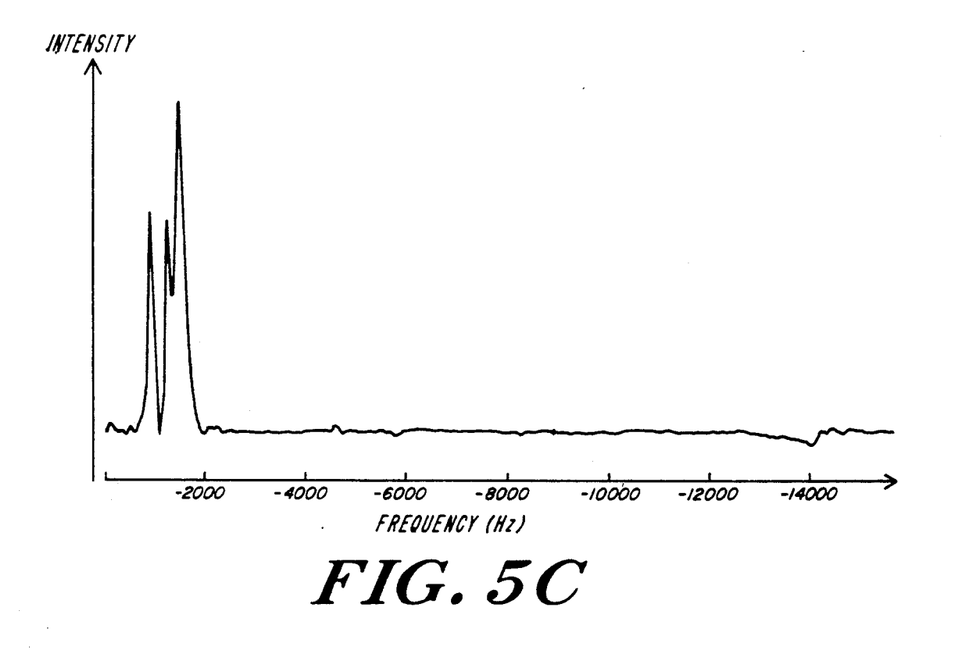
FIG. 5C is a spectral plot of the results of a CRAMPS experiment on para-dimethyoxybenzene using the inventive 24-pulse sequence illustrated in FIG. 2.

FIGS. 5A–5C are representative spectra of para dimethyoxybenzene obtained using the experimental setup described in connection with FIGS. 3 and 4. FIG. 5A shows a representative spectrum obtained using the aforementioned known MREV-8 RF pulse sequence. FIG. 5B shows a representative spectrum obtained using the aforementioned known BR-24 RF pulse sequence. FIG. 5C shows a representative spectrum obtained using the inventive pulse sequence shown in FIG. 2B. A comparison of the spectra illustrates a desired increase in resolution.

Figure 6A:
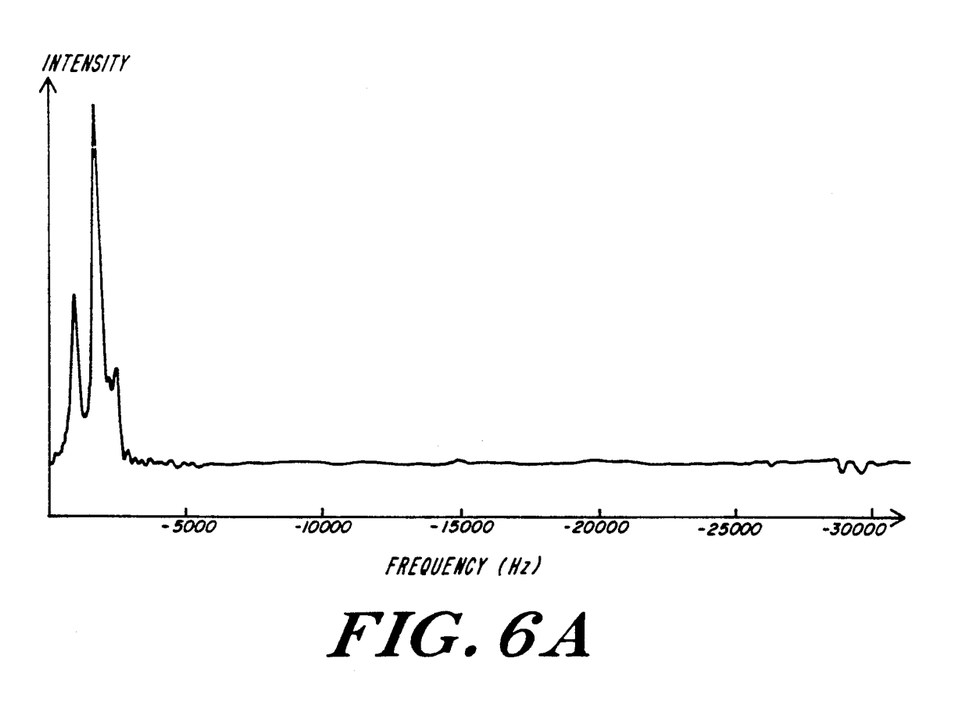
FIG. 6A is a spectral plot of the results of a CRAMPS experiment on poly(dimethylphenylene oxide) using a prior art MREV-8 pulse sequence.
Figure 6B:
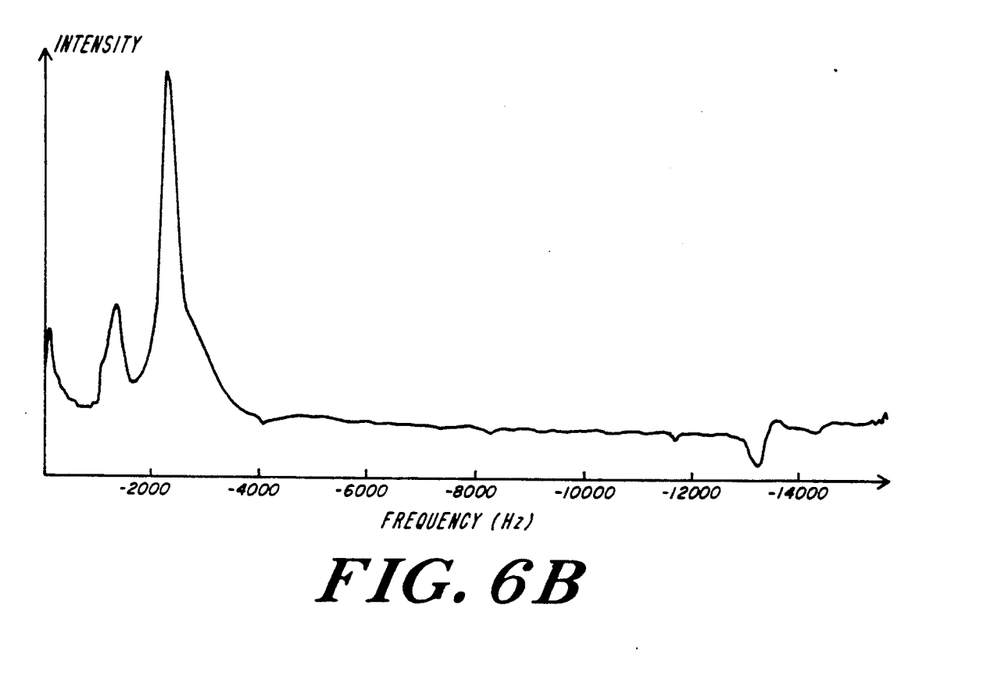
FIG. 6B is a spectral plot of the results of a CRAMPS experiment on poly(dimethylphenylene oxide) using a prior art BR-24 pulse sequence.
Figure 6C:
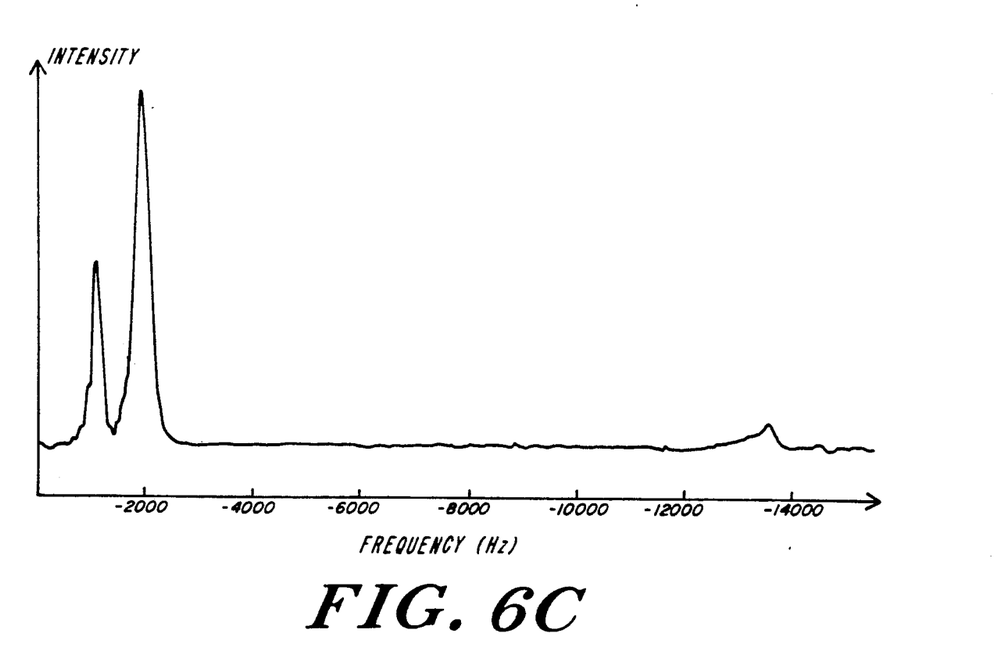
FIG. 6C is a spectral plot of the results of a CRAMPS experiment on poly(dimethylphenylene oxide) using the inventive 24-pulse sequence illustrated in FIG. 2.

FIGS. 6A–6C are representative spectra of poly(-dimethylphenylene oxide) obtained using the experimental setup described in connection with FIGS. 3 and 4. FIG. 6A shows a representative spectrum obtained using the aforementioned known MREV-8 RF pulse sequence. FIG. 6B shows a representative spectrum obtained using the aforementioned known BR-24 RF pulse sequence. FIG. 6C shows a representative spectrum obtained using the inventive pulse sequence shown in FIG. 2B. A comparison of the spectra illustrates a desired increase in resolution.

Although only one embodiment of the inventive pulse sequence has been described, several modifications and changes will be immediately apparent to those skilled in the art. For example, the illustrated pulse sequences may be modified in obvious ways to generate new pulse sequences which will perform according to the inventive method. These obvious modifications include utilizing variations of the inversion pulses to construct the pulse sequence. Table III lists some of the various composite inversion pulses which can be used. In Table III, the upper line of each six-pulse group represents the phases of the three pulse pairs that comprise the group. The corresponding lower line represents the spin states occurring in the three time intervals between pulses. The place holders A, B and C represent the spin operators, $I_x$, $I_y$ and $I_z$, such that if A is assumed to be $I_x$ then B is either $I_y$ or $I_z$ and C is the remaining operator that is not selected for A or B. The placeholders A, B and C are selected so that the expression ABC is a valid solid echo pulse pair.

TABLE III
ALTERNATIVE COMPOSITE INVERSION PULSES

| | |
|---|---|
| (XY) (X̄Y) (XY) | (YX) (ȲX) (YX) |
| (ABC) CAB̄) (B̄CĀ) | (ACB) (BAC̄) (C̄BĀ) |
| (XY) (XȲ) (XY) | (YX) (YX̄) (YX) |
| (ABC) (CĀB) (BC̄A) | (ACB) (BĀC) (CB̄A) |
| (X̄Y) (X̄Y) (X̄Y) | (ȲX) (ȲX) (ȲX) |
| (AB̄C̄) (C̄AB) (B̄CĀ) | (AC̄B̄) (B̄AC̄) (C̄BĀ) |
| (X̄Y) (XȲ) (X̄Y) | (ȲX) (YX̄) (ȲX) |
| (AB̄C̄) (C̄AB) (BC̄A) | (AC̄B̄) (B̄AC) (CB̄Ā) |
| (X̄Y) (XY) (X̄Y) | (ȲX) (YX) (ȲX) |
| (AB̄C) (CAB) (BCĀ) | (AC̄B) (BAC) (CBĀ) |
| (X̄Y) (X̄Ȳ) (X̄Y) | (ȲX) (ȲX̄) (ȲX) |
| (AB̄C) (CĀB̄) (B̄CĀ) | (AC̄B) (BĀC̄) (C̄BĀ) |
| (XȲ) (XY) (XȲ) | (YX̄) (YX) (YX̄) |
| (ABC̄) (C̄AB) (BCĀ) | (AC̄B) (B̄AC) (CB̄Ā) |
| (XȲ) (X̄Ȳ) (XȲ) | (YX̄) (ȲX̄) (YX̄) |
| (ABC̄) (CĀB̄) (BCĀ) | (AC̄B) (B̄AC̄) (CB̄Ā) |

When any of the listed pulses are used to construct a pulse sequence the following rules should be observed:
(a) the first group of six-pulses can correspond to any of the composite inversion pulses illustrated in Table III;
(b) the second group of six-pulses is symmetric with to the first group of six-pulses;
(c) the third group of six-pulses corresponds to a composite inversion pulse which has the same toggling frame state for the middle two inter pulse windows as the first group of six-pulses; and
(d) the fourth group of six-pulses is symmetric with to the third group of six-pulses.

In addition, as previously mentioned, the pulse sequence can be run as a semi-windowless or a windowless sequence. These modifications and other obvious changes are intended to be covered by the following claims.

What is claimed is:

1. In an NMR spectroscopy experiment for obtaining a frequency spectrum of abundant nuclei in a solid object in which said nuclei are placed in a uniform magnetic field and excited with a radio-frequency pulse, output magnetization is subsequently detected and said output magnetization is processed to obtain a frequency spectrum of said object, a method for improving spectral resolution comprising the step of:
   A. irradiating said nuclei with at least one radio-frequency pulse sequence after said nuclei are excited and before said output magnetization is detected, said pulse sequence being composed of at least two radio-frequency composite inversion pulses, each of said composite inversion pulses having a predetermined non-zero effective field in the same direction and wherein the second composite inversion pulse is symmetric with the first composite inversion pulse.

2. In an NMR spectroscopy experiment for obtaining a frequency spectrum of abundant nuclei in a solid object, the method according to claim 1 wherein each of said at least two composite inversion pulses is composed of three standard solid echo pulse pairs so that said radio-frequency pulse sequence is composed of at least six standard solid echo radio-frequency pulse pairs.

3. In an NMR spectroscopy experiment for obtaining a frequency spectrum of abundant nuclei in a solid object, the method according to claim 1 wherein said radio-frequency pulse sequence is composed of at least four composite inversion pulses, each of said four composite inversion pulses being comprised of three standard solid echo pulse pairs so that said radio-frequency pulse sequence is comprised of at least twelve standard solid echo radio-frequency pulse pairs.

4. In an NMR spectroscopy experiment for obtaining a frequency spectrum of abundant nuclei in a solid object, the method according to claim 3 wherein the twelve solid echo pulse pairs comprise a first, a second, a third and a fourth composite inversion pulses in which the second composite inversion pulse is symmetric with the first composite inversion pulse, the third composite inversion pulse has the same toggling frame state for the inter-pulse windows as the first composite inversion pulse and the fourth composite inversion pulse is symmetric with to the third composite inversion pulse.

5. In an NMR spectroscopy experiment for obtaining a frequency spectrum of abundant nuclei in a solid object, the method according to claim 3 wherein the radio-frequency pulse sequence comprises the radio-frequency pulses:

$$X, Y, -X, Y, X, Y, -Y, -X, -Y, X, -Y, -X, -X,$$
$$Y, -X, -Y, -X, Y, -Y, X, Y, X, -Y, X$$

where the phase of an X pulse differs from the phase of a Y pulse by 90° and the phase of an X pulse differs from the phase of a —X pulse by 180°.

6. In an NMR spectroscopy experiment for obtaining a frequency spectrum of abundant nuclei in a solid object, the method according to claim 1 wherein said radio-frequency pulse sequence is a semi-windowless pulse sequence and each of said at least two composite inversion pulses is comprised of three standard solid echo pulse pairs so that said radio-frequency pulse sequence is composed of at least six standard solid echo radio-frequency pulse pairs.

7. In an NMR spectroscopy experiment for obtaining a frequency spectrum of abundant nuclei in a solid object, the method according to claim 1 wherein said radio-frequency pulse sequence is a windowless pulse sequence comprised of at least four composite inversion pulses and each of said at least four composite inversion pulses is comprised of three standard solid echo pulse pairs so that said radio-frequency pulse sequence is composed of at least twelve standard solid echo radio-frequency pulse pairs.

8. An NMR spectroscopy method for obtaining a frequency spectrum of abundant nuclei in a solid object, said method comprising the steps of:
  A. placing said nuclei in a uniform magnetic field;
  B. exciting said nuclei with a radio frequency pulse;
  C. irradiating said nuclei with at least one radio-frequency pulse sequence, said pulse sequence being composed of at least two radio-frequency composite inversion pulses, each of said composite inversion pulses having a predetermined non-zero effective field in the same direction and wherein the second composite inversion pulse is symmetric with the first composite inversion pulse;
  D. detecting output magnetization; and
  E. processing said output magnetization signal to obtain a frequency spectrum of said object.

9. An NMR spectroscopy method according to claim 8 wherein each of said at least two composite inversion pulses is composed of three standard solid echo pulse pairs so that said radio-frequency pulse sequence is composed of at least six standard solid echo radio-frequency pulse pairs.

10. An NMR spectroscopy method according to claim 8 wherein said radio-frequency pulse sequence is composed of at least four composite inversion pulses, each of said four composite inversion pulses being comprised of three standard solid echo pulse pairs so that said radio-frequency pulse sequence is comprised of at least twelve standard solid echo radio-frequency pulse pairs.

11. An NMR spectroscopy method according to claim 10 wherein the twelve solid echo pulse pairs comprise a first, a second, a third and a fourth composite inversion pulses in which the second composite inversion pulse is symmetric with the first composite inversion pulse, the third composite inversion pulse has the same toggling frame state for the inter-pulse windows as the first composite inversion pulse and the fourth composite inversion pulse is symmetric with the third composite inversion pulse.

12. An NMR spectroscopy method according to claim 10 wherein the pulse sequence comprises the radio-frequency pulses:

$$X, Y, -X, Y, X, Y, -Y, -X, -Y, X, -Y, -X, -X,$$
$$Y, -X, -Y, -X, Y, -Y, X, Y, X, -Y, X$$

where the phase of an X pulse differs from the phase of a Y pulse by 90° and the phase of an X pulse differs from the phase of a $-X$ pulse by 180°.

13. An NMR spectroscopy method according to claim 9 wherein the pulse sequence comprises the radio-frequency pulses:

$$X, Y, -X, Y, X, Y, -Y, -X, -Y, X, -Y, -X,$$

where the phase of an X pulse differs form the phase of a Y pulse by 90° and the phase of an X pulse differs from the phase of a $-X$ pulse by 180°.

14. An NMR spectroscopy method according to claim 8 further comprising the step of:
  F. physically inclining said object along an axis at an angle of substantially 54° 44' to said magnetic field and physically spinning said object about said axis.

15. An NMR spectroscopy method according to claim 8 wherein the radio-frequency pulse sequence is a semi-windowless pulse sequence comprised of at least two composite inversion pulses, each of said at least two composite inversion pulses being composed of three standard solid echo pulse pairs so that said radio-frequency pulse sequence comprises at least six standard solid echo radio-frequency pulse pairs.

16. An NMR spectroscopy method according to claim 8 wherein the radio-frequency pulse sequence is a windowless pulse sequence comprised of at least four composite inversion pulses, each of said at least four composite inversion pulses being composed of three standard solid echo pulse pairs so that said radio-frequency pulse sequence comprises at least twelve standard solid echo radio-frequency pulse pairs.

* * * * *